United States Patent
Senda et al.

(10) Patent No.: US 8,735,943 B2
(45) Date of Patent: May 27, 2014

(54) SEMICONDUCTOR DEVICE WITH RECESS HAVING INCLINED SIDEWALL AND METHOD FOR MANUFACTURING THE SAME

(75) Inventors: Ryota Senda, Kanagawa-ken (JP); Hisao Kawasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,155

(22) Filed: Aug. 30, 2012

(65) Prior Publication Data

US 2013/0093006 A1 Apr. 18, 2013

(30) Foreign Application Priority Data

Oct. 14, 2011 (JP) ................. 2011-226801

(51) Int. Cl.
*H01L 29/66* (2006.01)

(52) U.S. Cl.
USPC ........................................................ 257/194

(58) Field of Classification Search
USPC ........................................................ 257/194
See application file for complete search history.

(56) References Cited

U.S. PATENT DOCUMENTS

| 7,315,076 B2 * | 1/2008 | Nomura et al. | 257/640 |
| 7,592,211 B2 * | 9/2009 | Sheppard et al. | 438/172 |
| 2010/0059800 A1 * | 3/2010 | Kawasaki | 257/288 |
| 2011/0127604 A1 | 6/2011 | Sato | |

FOREIGN PATENT DOCUMENTS

| JP | 61073381 A | 4/1986 |
| JP | 11-135477 | 5/1999 |
| JP | 2009-076845 | 9/2009 |
| JP | 2011114267 A | 6/2011 |

OTHER PUBLICATIONS

Yusof Ashaari Bin, Fabrication of Submicron HEMT Mushroom Gate Structure Using Electron Beam Lithography and Its Characterization, 1-24, 16 (2008).*
Translation of Japanese Office Action for Application No. 2011-226801, dated Aug. 27, 2013.
Japanese Office Action dated Jan. 29, 2014, filed in Japanese counterpart Application No. 2011-226801, 3 pages (with partial translation).

* cited by examiner

*Primary Examiner* — Anthony Ho
(74) *Attorney, Agent, or Firm* — Patterson & Sheridan, LLP

(57) ABSTRACT

A semiconductor device includes a semiconductor layer, an insulating film, a gate electrode, a drain electrode, and a source electrode. The semiconductor layer includes an active layer and is formed on a semi-insulating semiconductor substrate, and a tapered recess area having an inclined sidewall is formed on a surface of the semiconductor layer. The insulating film is formed on the semiconductor layer and has a through hole for exposing the recess area. The through hole has a tapered sidewall which is inclined at an angle smaller than the sidewall of the recess area. The gate electrode is formed so as to fill the recess area and the through hole. The drain electrode and the source electrode are formed at positions on opposite sides of the recess area on the semiconductor layer.

11 Claims, 6 Drawing Sheets

US 8,735,943 B2

SEMICONDUCTOR DEVICE WITH RECESS HAVING INCLINED SIDEWALL AND METHOD FOR MANUFACTURING THE SAME

CROSS-REFERENCE TO RELATED APPLICATION

This application is based upon and claims the benefit of priority from Japanese Patent Application No. 2011-226801, filed Oct. 14, 2011; the entire contents of which are incorporated herein by reference.

FIELD

Embodiments described herein relate to a semiconductor device and a method for manufacturing the same.

BACKGROUND

Semiconductor devices using a compound semiconductor such as GaAs, for example, a field-effect type transistor (hereinafter, referred to as FET) is frequently used because it has an excellent high-frequency characteristic and is operated in a microwave band. In semiconductor devices of this type, a recess area with a vertical sidewall is prepared on the surface of a semiconductor layer. Then, an insulating film having a through hole with a vertical sidewall, through which the recess area is exposed, is formed on the semiconductor layer, and a gate electrode is formed in the recess area and the through hole.

However, along with the miniaturization of recent semiconductor devices, the aspect ratio of the recess area has increased. When a gate electrode is formed in the recess area with a large aspect ratio by vapor-depositing, it is difficult to vapor-deposit a metal on the vertical sidewall of the recess area, and it is difficult to form a gate electrode so that the entire recess area is filled with the gate electrode. If the recess area is not filled with the gate electrode, the sidewall of the recess area becomes exposed, and the surface becomes contaminated during each manufacturing postprocess. This is one of causes for the degraded performance of the semiconductor devices.

In addition, in the process of forming the gate electrode by vapor-depositing, the metal is not vapor-deposited on the sidewall of the through hole of the insulating film. Instead, when the metal is vapor-deposited, it extends over the periphery of the through hole onto the surface of the insulating film. Therefore, a space (void) is generated between the gate electrode and the sidewall of the through hole. If a void is generated in this manner, cracks are generated in the gate electrode in the process for forming the gate electrode. In the gate electrode in which the cracks have been generated, the resistance value rises from a prescribed value, leading to one of the causes for the degraded performance of the semiconductor devices.

An example of related art includes Patent Reference of JP-A-11-135477.

DETAILED DESCRIPTION

The semiconductor devices of the following embodiments are field-effect type transistors (hereinafter, referred to as FET) using GaAs.

According to the embodiments, there are provided a semiconductor device, which can suppress the degradation in performance, and a method for manufacturing the semiconductor device.

The semiconductor device according to an embodiment has a semiconductor layer, an insulating film, a gate electrode, a drain electrode, and a source electrode. The semiconductor layer includes an active layer and is formed on a semi-insulating semiconductor substrate, and a tapered recess area having an inclined sidewall is formed on a surface of the semiconductor layer. The insulating film is formed on the semiconductor layer and has a through hole for exposing the recess area. This through hole has a tapered sidewall which is inclined at an angle smaller than the angle of inclination of the sidewall of the recess area. The gate electrode is formed so as to fill the recess area and the through hole. The drain electrode and source electrode are formed at positions on opposite sides of the recess area on the semiconductor layer.

In addition, the method for manufacturing the semiconductor device according to an embodiment includes the steps of forming an insulating film, forming a first resist film, forming a recess area, forming a through hole, forming a second resist film, and vapor-depositing a metal. In the step of forming the insulating film, the insulating film is formed on a semiconductor layer, which is formed on a semi-insulating semiconductor substrate and includes an active layer. In the step of forming the first resist film is formed with an opening on the surface of the insulating film. In the step of forming the recess area, the insulating film is removed by using the first resist film as a mask to form a tapered recess area whose sidewall is inclined on the surface of the semiconductor layer. In the step of forming a through hole, the through hole is formed with a tapered sidewall that is inclined at an angle smaller than the angle of inclination of the sidewall of the recess area and exposes the recess area. In the step of forming the second resist film, the second resist layer is formed with an opening, which exposes the through hole, on the surface of the insulating film. In the step of vapor-depositing the metal, metal is vapor-deposited by using the second resist film as a mask so as to fill the recess area and the through hole.

(Embodiment 1)

Figure 1:
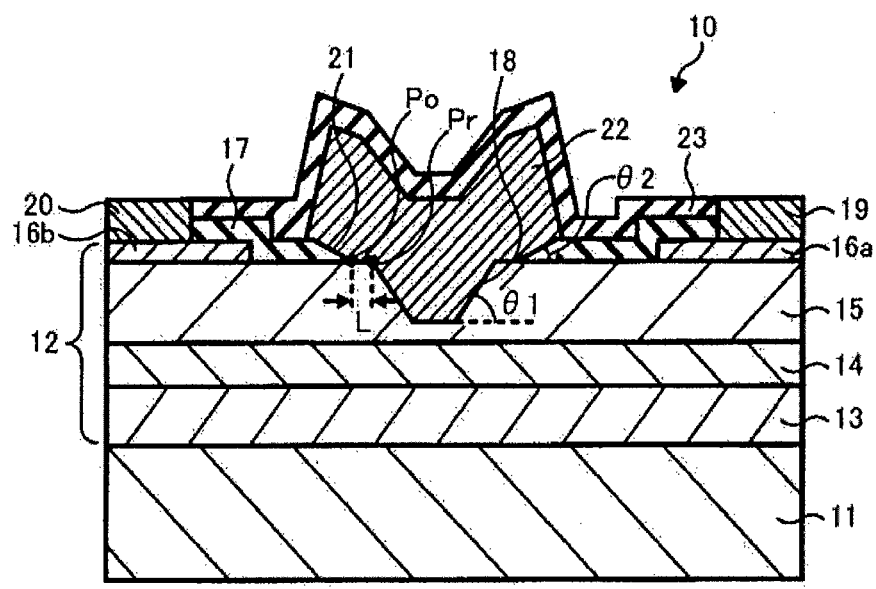
FIG. 1 is a cross-section schematically showing the semiconductor device of a first embodiment.

FIG. 1 is a cross-section schematically showing a semiconductor device 10 of a first embodiment. Here, for convenience of explanation, the semiconductor device 10 shown in FIG. 1 has a size different from an actual size. An example of the actual size of the semiconductor device 10 will be given later.

In the semiconductor device 10 of the first embodiment shown in FIG. 1, a semiconductor layer 12 is formed on the surface of a semi-insulating semiconductor substrate 11. The semiconductor layer 12 includes buffer layer 13, an active layer 14, in which electrons flow, Schottky junction layer 15, and ohmic contact layers 16a and 16b sequentially from the bottom. The semi-insulating semiconductor substrate 11, for example, is composed of a GaAs substrate, and the semiconductor layer 12 is composed of a material having GaAs as a base.

The buffer layer 13 is formed on the surface of the semi-insulating semiconductor substrate 11. The buffer layer 13, for example, is formed by laminating GaAs and AlGaAs.

The active layer 14 is formed on the surface of the buffer layer 13. The active layer 14 is an electron transit layer, and a two-dimensional electron gas layer is formed in the vicinity of the surface of this layer. With the movement of electrons in the gas layer, a conductive state is set between a drain and a source. The active layer 14, for example, is composed of an n-type GaAs.

The Schottky junction layer 15 is formed on the surface of the active layer 14. The Schottky junction layer 15 is an electron supply layer for supplying electrons to the active layer 14, that is, the electron transit layer. The Schottky junction layer 15, for example, is composed of AlGaAs.

This Schottky junction layer 15 is formed thick to suppress the interface state density, which is generated at the boundary with an insulating film 17, which is formed on the layer 15 and will be described later, and prevents it from having an influence on a two-dimensional electron gas layer that is generated in the vicinity of the surface of the active layer 14.

This Schottky junction layer 15 has a concave recess area 18 on the surface. The sectional shape of the recess area 18 is a so-called tapered shape in which the sidewall is inclined. Here, if the angle θ1 of inclination of the sidewall of the recess area 18, as shown in FIG. 1, is defined as an angle θ1 between the bottom face of the recess area 18 and the sidewall, it is preferable for the angle θ1 to be small, and a range of 20° to 85° is acceptable.

The ohmic contact layers 16a and 16b are formed at positions separated from each other on the surface of the Schottky junction layer 15. These ohmic contact layers 16a and 16b are formed at positions on the surface of the Schottky junction layer 15 to sandwich the recess area 18. In this embodiment, these ohmic contact layers 16a and 16b, for example, are formed so that the recess area 18 is arranged at a position biased to one side from the middle position of these ohmic contact layers 16 (the position is biased to the left in FIG. 1). Each of these layers, for example, is composed of an n+ type GaAs.

On the surface of one ohmic contact layer 16a (ohmic contact layer 16a at right in FIG. 1), a drain electrode 19 in ohmic contact with the layer 16a is formed, and on the surface of the other ohmic contact layer 16b (ohmic contact layer 16b at left in FIG. 1), a source electrode 20 in ohmic contact with the layer 16b is formed. These electrodes 19 and 20, for example, have AuGe and Ni laminated in that order.

Here, in the ohmic contact layers 16a and 16b, the recess area 18 may be formed between the ohmic contact layers 16a and 16b. For example, the ohmic contact layers 16a and 16b may also be formed so that the recess area 18 is formed at the middle position of the ohmic contact layers 16a and 16b.

The insulating film 17 is formed between the drain electrode 19 and the source electrode 20. In other words, the insulating film 17 is formed on the surface of the Schottky junction layer 15, including a part on the surface of the ohmic contact layers 16a and 16b. The insulating film 17, for example, is composed of SiN.

Here, the Schottky junction layer 15, for example, is composed of AlGaAs, whereas the insulating film 17, for example, is composed of SiN. Since the materials of both layers are different, the interface state density is generated on their boundary face.

This insulating film 17 has a through hole 21. The through hole 21 is formed at the position where the recess area 18 is exposed by the through hole 21. In this embodiment, the through hole 21, for example, is formed at a position slightly biased to the source electrode 20 from the central part of the insulating film 17 so that it corresponds to the position of the recess area 18. In addition, in this embodiment, the through hole 21 is formed at the position where the upper end Pr of the recess area 21 is exposed and the surface of the Schottky junction layer 15 at the periphery of the recess area 21 is exposed. Therefore, the through hole 21 is formed at the position where the lower end Po of the through hole 21 and the upper end Pr of the recess area are separated from each other.

The sectional shape of this through hole 21 is a so-called tapered shape in which the sidewall is inclined. Here, if the angle θ2 of inclination of the sidewall of the through hole 21, as shown in FIG. 1, is defined as an angle θ2 between the surface of the Schottky junction layer 15 and the sidewall of the through hole 21, the angle θ2 is smaller than the angle θ1 of inclination of the sidewall of the recess area 18. Here, it is preferable for the angle θ2 of inclination of the sidewall of the through hole 21 to be smaller than θ1, and a range of 10° to 80° is preferable.

A gate electrode 22 is formed in a part on the surface of the Schottky junction layer 15 and the surface of the insulating film 17, where the part includes the inside of the recess area 18 and the through hole 21 and is exposed between them. The gate electrode 22 fills up the recess area 18 and the through hole 21 and is protruded upward from the through hole 21, and part of the gate electrode protrudes over the surface of the insulating film 17. In the gate electrode 22, the sectional shape of the upward-protruded part from the through hole 21 is a trapezoidal shape, and the central part of its upper side is a downward concave shape. In other words, the sectional shape of the gate electrode 22 is an approximate Y shape. In this gate electrode 22, for example, Ti, Pt, and Au are laminated in that order.

Since the gate electrode 22 is formed so that it fills up the recess area 18 and the through hole 21, it contacts the Schottky junction layer 15 between the upper end Pr of the recess area 18 and the lower end Po of the through hole 21. In the gate electrode 22, the part in contact with the Schottky junction layer 15 has a functional equivalent to that of a gate field plate electrode. Therefore, the withstand voltage of the semiconductor device 10 is improved by the contact of the gate electrode 22 and the Schottky junction layer 15 between the upper end Pr of the recess area 18 and the lower end Po of the through hole 21.

A surface protective layer 23 is formed between the drain electrode 19 and the source electrode 20 including the gate electrode 22 and the insulating film 17. In other words, the surface protective layer 23 is formed on the surface of the insulating film 17 to cover the gate electrode 22. The surface protective layer 23, for example, is composed of SiN. Here, since the surface protective layer 23 contacts the insulating film 17, it is preferably formed of the same material; however it may also be formed of a different material.

In this semiconductor device 10, the thickness of the buffer layer 13, active layer 14, Schottky junction layer 15, and ohmic contact layer 16, for example, is about 1 μm, 0.05 μm, 0.1 μm, and 0.02 μm, respectively. In addition, the distance between the drain electrode 19 and the source electrode 20, for example, is about 10 μm; the width of the upward protruded part in the gate electrode 22 from the through hole 21 of the insulating film 17, for example, is about 1 μm; and the width of the upper end Pr of the recess area 18, for example, is about 0.5 μm.

Moreover, for example, in the semiconductor device with this size, the distance L between the lower end Po of the through hole 21 of the insulating film 17 and the upper end Pr of the recess area 18, for example, is about 0.01 to 0.50 μm. Here, the longer the distance L, the easier it is to manufacture in terms of the relative position precision of the recess area 18 and the through hole 21 of the insulating film 17; however, since the contact area of the gate electrode 22 and the Schottky junction layer 15 increases, the parasitic capacitance increases. If the semiconductor device 10 of this embodiment is a FET that is used in a microwave band, the distance between the lower end Po of the through hole 21 and the upper end Pr of the recess area 18 is preferably about 0.1 μl, in consideration of the easiness of manufacturing and the degradation of the performances of the device 10 due to the increase in the parasitic capacitance.

Next, the method for manufacturing the semiconductor device 10 of this embodiment will be explained with reference to FIGS. 2 to 7. FIGS. 2 to 7 are each cross-sections corresponding to FIG. 1 for explaining the method for manufacturing the semiconductor device 10 shown in FIG. 1.

Figure 2:
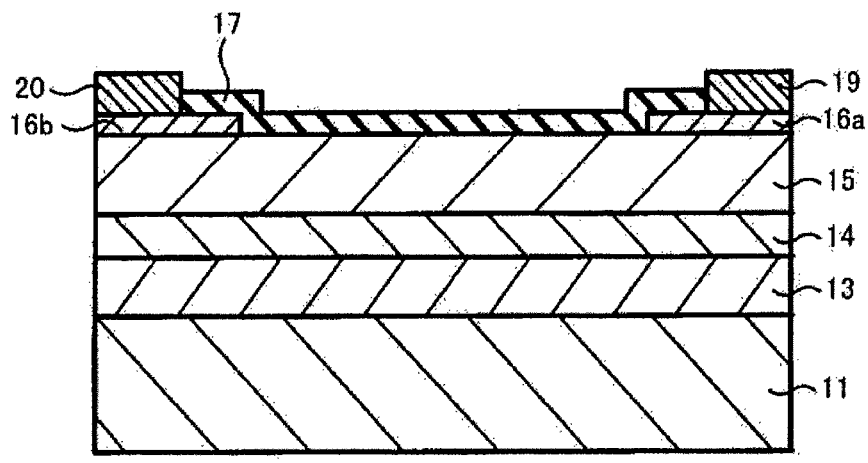
FIG. 2 is a cross-section corresponding to FIG. 1 for explaining the method for manufacturing the semiconductor device of the first embodiment and shows a process for forming an insulating film.

First, as shown in FIG. 2, the buffer layer 13, active layer 14, Schottky junction layer 15, and ohmic contact layers 16a and 16b are formed in that order and in sequence on the semi-insulating semiconductor substrate 11. In addition, the drain electrode 19 and the source electrode 20 are formed on the surface of the ohmic contact layers 16a and 16b, and the insulating film 17 is formed between these electrodes 19 and 20.

The buffer layer 13, active layer 14, Schottky junction layer 15, and ohmic contact layers 16a and 16b, for example, are each formed by epitaxial growth, etc.; the drain electrode 19 and the source electrode 20, for example, are formed by a lift-off method, and the insulating film 17, for example is formed by a CVD (chemical vapor deposition) method.

Figure 3:
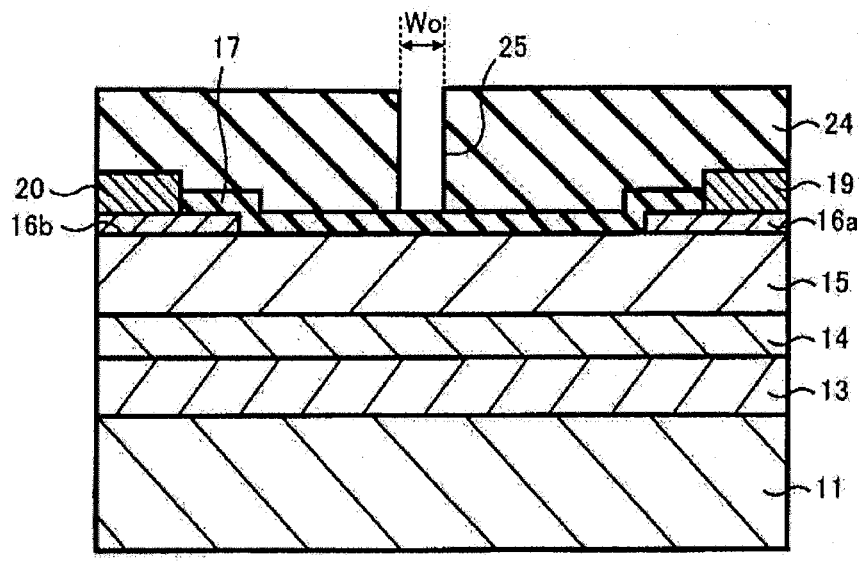
FIG. 3 is a cross-section corresponding to FIG. 1 for explaining the method for manufacturing the semiconductor device of the first embodiment and shows a process for forming a first resist film.

Next, as shown in FIG. 3, a first resist film 24 is spread on the surface of the insulating film 17 containing the drain electrode 19 and the source electrode 20, and a first opening part 25 is formed at a prescribed position of the first resist film 24. The first opening part 25 is prepared to form the recess area 18 (FIG. 1) in the Schottky junction layer 15 as well as the through hole 21 (FIG. 1) in the insulating film 17 during a postprocesses. The first opening part 25, for example, is formed by patterning the first resist film 24. Here, the width Wo of the first opening part 25 is formed so that it is greater than the gate length of the gate electrode 22 (FIG. 1), in consideration of the etching rate in an etching process for forming the recess area 18 (FIG. 1) later.

Figure 4:
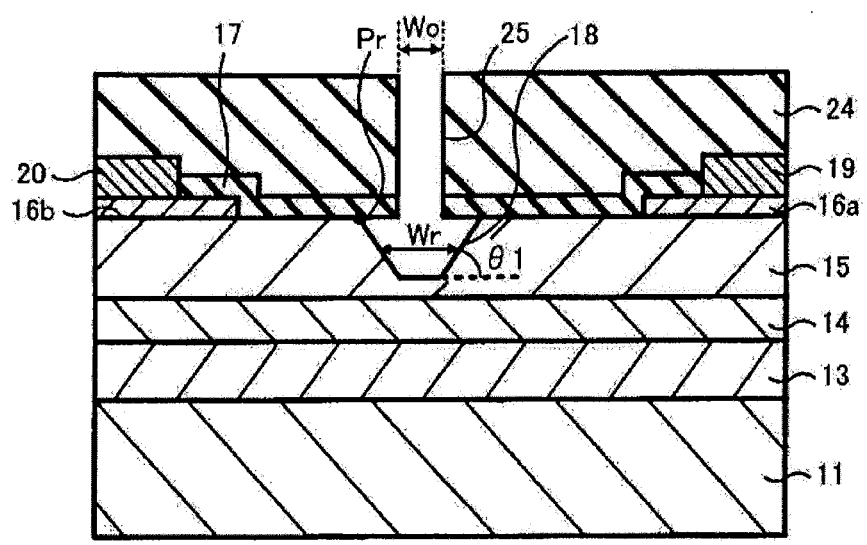
FIG. 4 is a cross-section corresponding to FIG. 1 for explaining the method for manufacturing the semiconductor device of the first embodiment and shows a process for forming a recess area.

Next, as shown in FIG. 4, the insulating film 17, which is exposed from the first opening part 25 of the first resist film 24, is removed. The insulating film is removed by etching using RIE (reactive-ion etching), for instance.

In the process for removing the insulating film 17, RIE etching is employed, allowing the first opening part 25 of the first resist film 24 to be extended with good precision to the insulating film 17. Therefore, the gate electrode 22 (FIG. 1), which is formed during a postprocess, is suppressed from a shift formation from a desired gate length. As a result, even if the gate length is fine, the semiconductor device 10 may be manufactured without deviating from desired characteristics.

Next, as shown in FIG. 4, using the first resist film 24 having the first opening part 25 as a mask, part of the surface of the Schottky junction layer 15 is removed to form the recess area 18. The recess area 18, for example, is formed by wet-etching so that the sidewall has a desired $\theta 1$ of inclination. In addition, the recess area 18 is formed at a desired depth.

In the wet etching that is adopted in this process, the etching is advanced toward the lower side of the Schottky junction layer 15, and the etching is advanced towards a direction parallel with the Schottky junction layer 15. Therefore, if the wet etching is applied, the recess area 18 is deepened with an increase in the etching time, and the width Wr of the recess area 18 becomes wider. Therefore, the recess area 18 is formed in a tapered shape so that its upper end Pr is drawn under the insulating film 17.

In the process for forming the recess area 18, the angle $\theta 1$ of inclination of the sidewall of the recess area 18 to be formed can be controlled by controlling the crystal orientation of the Schottky junction layer 15 and the composition of the etching solution; as the downward-advancing etching rate becomes slower and the parallel-advancing etching rate becomes faster, the angle $\theta 1$ of inclination of the sidewall of the recess area 18 is decreased. On the other hand, as the downward-advancing etching rate becomes faster and the parallel-advancing etching rate becomes slower, the width of the bottom face of the recess area 18 is fitted to the width Wo of the first opening part of the first resist film.

In addition, in the process for forming the recess area 18, the depth of the recess area 18 can be controlled by adjusting the etching time along with the control of the etching rate. As the etching time is lengthened, the depth of the recess area 18 is deepened.

In other words, the recess area 18 is formed by controlling the etching rate and the etching time so that it has a desired depth, the sidewall has a desired angle $\theta 1$ of inclination, and the width of the bottom face of the recess area 18 is a desired width (=gate length of the gate electrode 22 (FIG. 1)).

Figure 5:
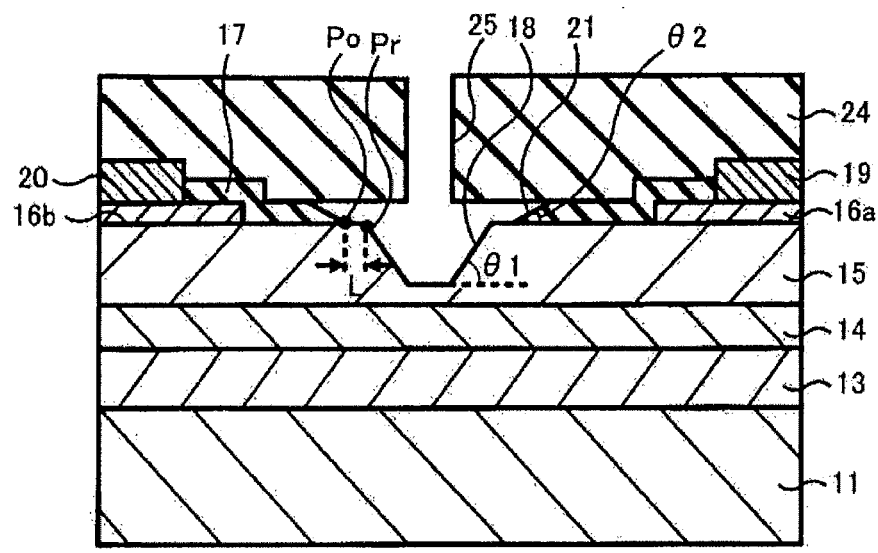
FIG. 5 is a cross-section corresponding to FIG. 1 for explaining the method for manufacturing the semiconductor device of the first embodiment and shows a process for forming a through hole in the insulating film.

Next, as shown in FIG. 5, the insulating film 17 is further removed by using the first resist film 24 having the first opening part 25 as a mask, forming the tapered through hole 21 in the insulating film 17. The through hole 21, for example, is formed by etching back for a prescribed time using a buffered fluoric acid so that the sidewall has a desired angle $\theta 2$ of inclination ($<\theta 1$). In addition, the through hole 21 is formed so that its lower end Po and the upper end Pr of the recess area 18 is separated by a desired distance L.

The etching back that is employed in this process is wet etching. With wet etching, the etching is advanced toward the lower side of the insulating film 17, and the etching is advanced toward the direction parallel with the insulating film 17. Therefore, the through hole 21 to be formed is formed in a tapered shape.

In the process for forming the through hole 21, the θ2 of inclination of the sidewall of the through hole 21 to be formed can be controlled by adjusting the adhesive strength of the first resist film 24 and the insulating film 17 and the concentration of the buffered fluoric acid. Through the control of the adhesive strength of the first resist film 24 and the insulating film 17 and the concentration of the buffered fluoric acid, as the downward-advancing etching rate becomes slow and the parallel-advancing etching rate becomes fast, the angle θ2 of inclination of the sidewall of the through hole is decreased.

In addition, in the process for forming the through hole 21, the distance L1 between the lower end Po of the through hole 21 and the upper end Pr of the recess area 18 can be controlled by adjusting the etching time along with the control of the etching rate. As the etching time is lengthened, the distance L between the lower end Po of the through hole 21 and the upper end Pr of the recess area is lengthened.

In other words, the through hole 21 is formed by controlling the etching rate and the etching time so that the sidewall has a desired angle θ2 of inclination and the distance between the lower end Po of the through hole and the upper end Pr of the recess area has a desired distance.

Figure 6:
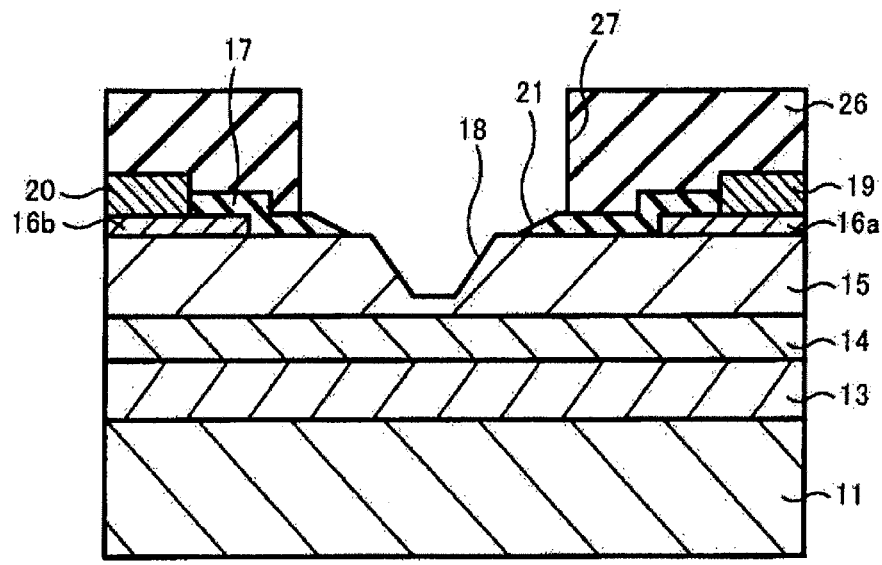
FIG. 6 is a cross-section corresponding to FIG. 1 for explaining the method for manufacturing the semiconductor device of the first embodiment and shows a process for forming a second resist film.

Next, after removing the first resist film 24, as shown in FIG. 6, a second resist film 26 is spread on the surface of the insulating film 17 containing the drain electrode 19 and the source electrode 20, and a second opening part 27 is formed at a prescribed position of the second resist film 26. The second opening part 27 is prepared to form the gate electrode 22 (FIG. 1) so that the recess area 18 and the through hole 21 of the insulating film 17 are filled in the following steps. Therefore, the second opening part 27 is formed over the through hole 21 so that the through hole 21 is exposed. The second opening part 27, for example, is formed by patterning the second resist film 26.

Figure 7:
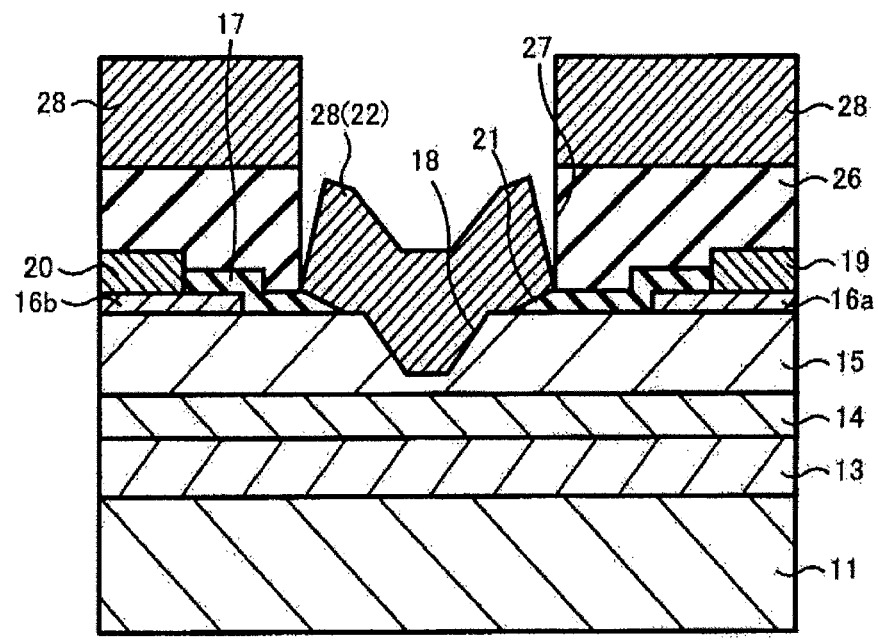
FIG. 7 is a cross-section corresponding to FIG. 1 for explaining the method for manufacturing the semiconductor device of the first embodiment and shows a process for forming a gate electrode.

Next, as shown in FIG. 7, using the second resist film 26 having the second opening part 27 as a mask, several metal films 28 that make up the gate electrode 22, for example, Ti, Pt, and Au, are vapor-deposited in that order. Therefore, the gate electrode 22 is formed.

In this vapor-deposition process, since both the sidewall of the recess area 18 and the sidewall of the through hole 21 of the insulating film 17 are inclined, each metal film 28 is vapor-deposited on these sidewalls. Therefore, the gate electrode 22 is formed so that the recess area 18 and the through hole 21 of the insulating film 17 are filled.

In addition, in this vapor-deposition process, since the sidewall of the second opening part 27 of the second resist film 26 is almost perpendicular, it is difficult to vapor-deposit each metal film 28 on the sidewall. Therefore, the sectional shape of the upward-protruded part in the gate electrode 22 from the through hole 21 is a trapezoidal shape.

Before the formation process of the gate electrode 22 explained above, most of the surface of the Schottky junction layer 15 is covered with the insulating film 17. Therefore, the surface of the Schottky junction layer 15 is suppressed from being contaminated in the formation process of the gate electrode 22 and during each manufacturing postprocess.

Here, in this process, if the sidewall of the recess area 18 is perpendicular, that is, the angle θ1 of inclination of the sidewall is 90°, each metal film 28 cannot be vapor-deposited on the sidewall of the recess area 18. Therefore, the gate electrode 22 is not formed so that the recess area 18 is filled but is formed so that it is separated from its sidewall. As a result, a gap is formed between the sidewall of the recess area 18 and the gate electrode 22, and the Schottky junction layer 15 is exposed in the recess area 18. This exposed part is contaminated during each manufacturing postprocess.

Moreover, in the vapor-deposition process, if the sidewall of the through hole 21 of the insulating film 17 is perpendicular, that is, the angle θ2 of inclination of the sidewall is 90°, each metal film 28 cannot be vapor-deposited on the sidewall of the through hole 21, but is formed so that it extends over the insulating film 17 at the periphery of the through hole 21. Therefore, the gate electrode 22 is formed so that the through hole 21 is not filled, so that a space (void) is formed between the sidewall of the through hole 21 and the gate electrode 22.

Finally, using a lift-off method, the second resist film 26 and each metal film 28 on the resist film 26 are removed. Next, a surface protective layer 23 is formed on the surface of the insulating film 17 surrounding the gate electrode 22. The surface protective layer 23, for example, is formed by the CVD (chemical vapor deposition) method. Through the above respective processes, the semiconductor device 10 shown in FIG. 1 can be manufactured.

According to the semiconductor device 10 of this embodiment and the method for manufacturing the semiconductor device 10 explained above, the recess area 18 can be formed with the sidewall inclined so that the gate electrode 22 is filled without a gap in the recess area 18. Therefore, after the gate electrode 22 is formed, the Schottky junction layer 15 can be suppressed from being exposed in the recess area 18. As a result, in the process that removes the second resist film 26 and forms the surface protective layer 23, the Schottky junction layer 15 can be suppressed from being contaminated.

In addition, according to the semiconductor device 10 of this embodiment and the method for manufacturing the semiconductor device 10, the through hole 21 of the insulating film 17 is formed so that its sidewall is inclined. Therefore, the gate electrode 22 can be formed so that it is filled in the through hole 21 of the insulating film 17 without a gap. Therefore, a space (void) can be suppressed from being generated between the gate electrode 22 and the through hole 21 of the insulating film 17. As a result, the generation of cracks in the gate electrode 22 due to the space (void) can be suppressed.

In other words, according to the semiconductor device 10 of this embodiment and the method for manufacturing the semiconductor device 10, the Schottky junction layer 15 can be suppressed from being contaminated, and cracks can be suppressed from being generated in the gate electrode 22. Therefore, the characteristic degradation of the semiconductor device 10 can be suppressed.

Moreover, according to the semiconductor device 10 of this embodiment and the method for manufacturing the semiconductor device 10, the gate electrode can be formed so that it is filled in the recess area 18 and the through hole 21 of the insulating film 17 without a gap. Therefore, compared to conventional semiconductor devices having a gap between the recess area and the through hole of the insulating film and the gate electrode, the sectional area of the gate electrode 22 can be widened while maintaining the gate length. As a result, the resistance of the gate electrode 22 can be lowered, thus being able to raise the performance of the semiconductor device 10.

Furthermore, according to the semiconductor device 10 of this embodiment and the method for manufacturing the semiconductor device 10, no space (void) is formed between the gate electrode 22 and the through hole 21 of the insulating film 17. Therefore, gases such as air in the space (void) that could be expanded along with the temperature rise of the device 10 are prevented, thus being able to suppress the damage or peeling-off of the gate electrode 22.

In other words, according to conventional semiconductor devices and the conventional methods for manufacturing the semiconductor devices, since the sidewall of the through hole of the insulating film is perpendicular, a space (void) is formed between the through hole and the gate electrode. This space (void) remains even after the manufacture of the device. Therefore, gases such as air in the space (void) are expanded by heat generated during the operation of the device. Thereby, there is a possibility that the gate electrode is damaged or peeled off from the Schottky junction layer. However, according to the semiconductor device 10 of this embodiment and the method for manufacturing the semiconductor device 10, since no space (void) is formed, the damage or peeling-off of the gate electrode 22 can be suppressed.

(Modified Example Embodiment 1)

Figure 8:
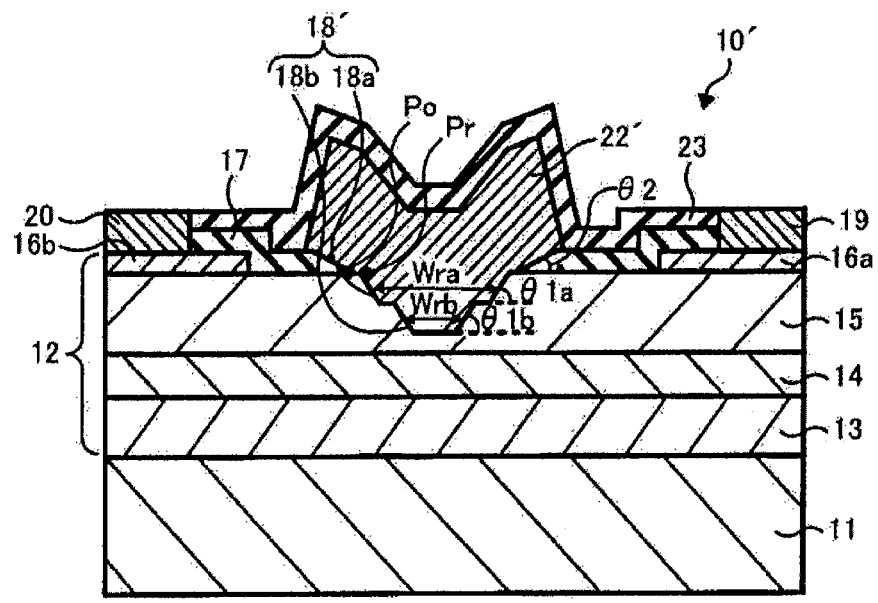
FIG. 8 is a cross-section schematically showing the semiconductor device of a modified example of the first embodiment.

FIG. 8 is a cross-section schematically showing a semiconductor device 10' of a modified example of the first embodiment. The difference between this semiconductor device 10' and the semiconductor device 10 of the first embodiment is that a recess area 18' with a two-step shape is installed in the Schottky junction layer 15 to further improve the withstand voltage.

In other words, as shown in FIG. 8, in the semiconductor 30 of the modified example of the first embodiment, the Schottky junction layer 15 has a first recess area 18a and a second recess area 18b on the surface thereof. The width Wra of the first recess area 18a is formed so that it is wider than the width Wrb of the second recess area 18b, and the first recess area 18a is formed on the second recess area 18b.

Each sectional shape of the first recess area 18a and the second recess area 18b is a so-called tapered shape in which the sidewall is inclined. Here, it is preferable for both the angle $\theta 1a$ of inclination of the first recess are and the angle $\theta 1b$ of inclination of the second recess area to be small, and these angles $\theta 1a$ and $\theta 1b$ are preferably in a range of 20° to 85°, respectively.

A gate electrode 22' is formed so that the recess area 18' with a two-step shape and the through hole 21 of the insulating film 17 are filled. At the same time, the gate electrode is protruded upward from the through hole 21 so that part of it extends over the surface of the insulating film 17.

Figure 9:
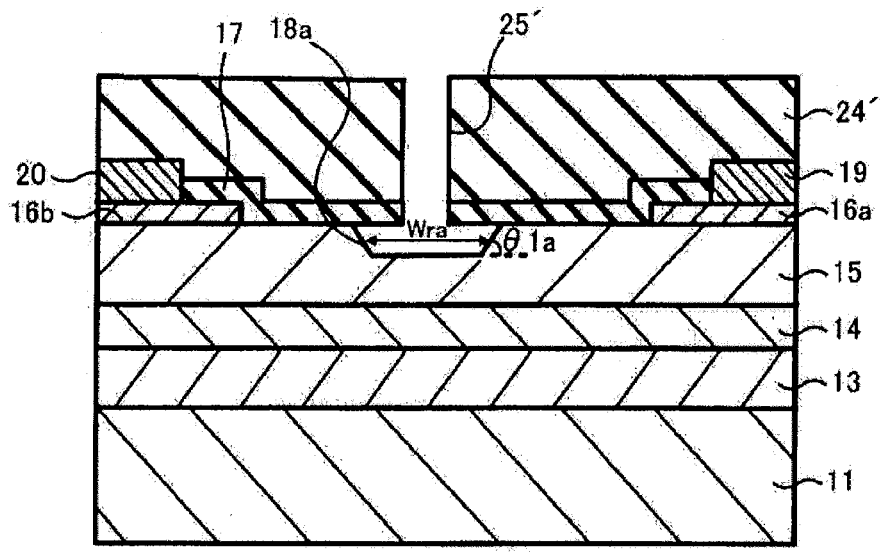
FIG. 9 is a cross-section corresponding to FIG. 8 for explaining the method for manufacturing the semiconductor device of the modified example of the first embodiment and shows a process for forming a recess area.
Figure 10:
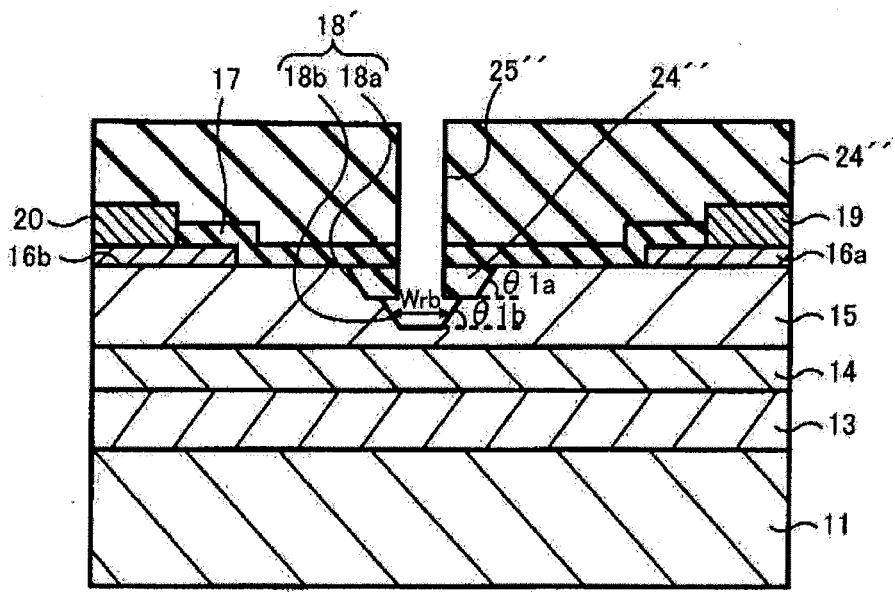
FIG. 10 is a cross-section corresponding to FIG. 8 for explaining the method for manufacturing the semiconductor device of the modified example of the first embodiment and shows the process for forming the recess area.

The method for manufacturing the semiconductor device 10' can be applied similarly to the method for manufacturing the semiconductor device 10 of the first embodiment except for the process for forming the recess area 18' with a two-step shape. Accordingly, the process for forming the recess area 18' with a two-step shape will be explained with reference to FIGS. 9 and 10. FIGS. 9 and 10 are cross-sections corresponding to FIG. 8 for explaining the method for manufacturing the semiconductor device 10' of the modified example.

First, as shown in FIG. 9, the insulating film 17, which is exposed from a first opening part 25' of a first resist film 24', is removed by using RIE etching, for instance. This process is similar to the process shown in FIG. 4.

Next, as shown in FIG. 9, using the first resist film 24' having the first opening part 25' as a mask, part of the surface of the Schottky junction layer 15 is removed, forming the first recess area 18a. This first recess area 18a, for example, is formed by wet-etching similar to the process shown in FIG. 4, so that the sidewall has a desired angle $\theta 1a$ of inclination. At that time, compared with the wet etching shown in FIG. 4, the etching rate of the etching advancing in the horizontal direction is faster, and the etching rate of the etching advancing in the vertical direction is slower. Therefore, compared with the recess area 18 (FIG. 1) of the semiconductor device 10 of the first embodiment, the first recess area 18a with a wide recess width Wra and a shallow depth direction can be formed.

Next, after removing the first resist film 24', as shown in FIG. 10, a first resist film 24" having a first opening part 25" is formed; and, using this resist film as a mask, part of the bottom face of the first recess area 18a is removed, forming the second recess area 18b. The second recess area 18b, for example, is also formed by wet-etching so that the side wall has a desired angle $\theta 1b$ of inclination. At that time, compared with the wet etching shown in FIG. 9, the etching rate of the etching advancing in the horizontal direction is slower. Therefore, compared with the first recess area 18a, the second recess area 18b with a wide recess width Wrb can be formed.

In this manner, each process, after forming the recess area 18' with a two-step shape including the first recess area 18a and the second recess area 18b, is similar to those of the method for manufacturing the semiconductor device 10 of the first embodiment. Therefore, their explanation is omitted.

In the semiconductor device 10' of the modified example and the method for manufacturing the semiconductor device 10' explained above, the first and second recess areas 18a and 18b and the through hole 21 of the insulating film 17 can also be formed so that their sidewalls are inclined. Therefore, for reasons similar to that given for the semiconductor device 10 of the first embodiment and the method for manufacturing the semiconductor device 10, the Schottky junction layer 15 in the recess area 18' can be suppressed from being contaminated. In addition, the generation of cracks in the gate electrode 22' can be suppressed. Thereby, the characteristic degradation of the semiconductor device 10' can be suppressed.

In addition, in regards to the semiconductor device 10' of the modified example and the method for manufacturing the semiconductor device 10', the gate electrode 22' can be formed so that the first and second recess areas 18a and 18b and the through hole 21 of the insulating film 17 are filled without a gap. Therefore, for reasons similar to that given for the semiconductor device 10 of the first embodiment and the method for manufacturing the semiconductor device 10, the resistance of the gate electrode 22' can be lowered, the performances of the semiconductor device 10' can be raised, and the damage to the gate electrode 22 or peeling-off of the gate electrode 22' from the Schottky junction layer 15 can be suppressed.

(Embodiment 2)

Figure 11:
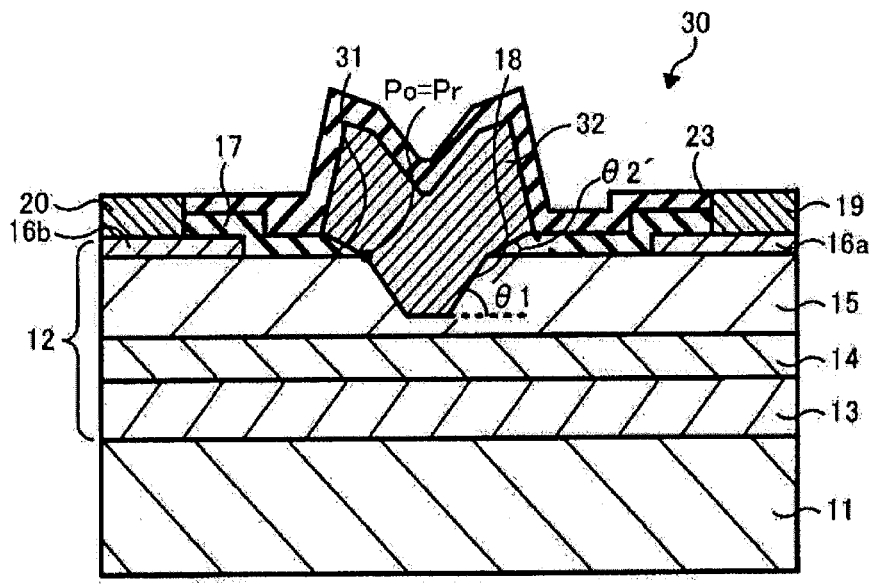
FIG. 11 is a cross-section schematically showing the semiconductor device of a second embodiment.

FIG. 11 is a cross-section schematically showing a semiconductor device 30 of a second embodiment. The difference between this semiconductor device 30 and the semiconductor device 10 of the first embodiment is that a through hole 31 is installed so that the upper end Pr of the recess area 18 is coincident with the lower end Po of the through hole 31 of the insulating film 17.

In other words, as shown in FIG. 11, in the semiconductor device 30 of the second embodiment, the through hole 31 of the insulating film 17 is formed at the position where the recess area 18 is exposed from the through hole 31. In this embodiment, this through hole 31 is formed so that its lower end Po is coincident with the upper end Pr of the recess area 18.

The sectional shape of the through hole 31 is a shape in which the sidewall is inclined, and the angle $\theta 2'$ of inclination is smaller than the angle $\theta 1$ of inclination of at least the sidewall of the recess area 18. Here, it is preferable for the angle $\theta 2'$ of inclination of the sidewall of the through hole 31 to be smaller than θ1, and a range of 10° to 80° is preferable. The reason for this difference is similar to that given for the through hole 21 (FIG. 1) installed in the semiconductor device 10 of the first embodiment.

A gate electrode 32 is formed so that the recess region 18 and the through hole 31 are filled. At the same time, this gate electrode is protruded upward so that part of it extends over the surface of the insulating film 17. Here, since the upper end Pr of the recess area 18 and the lower end Po of the through hole 31 of the insulating film 17 are coincident with each other, the gate electrode 32 contacts the Schottky junction layer 15 in only the recess area 18 and does not contact with the Schottky junction layer 15 in other areas.

Figure 12:
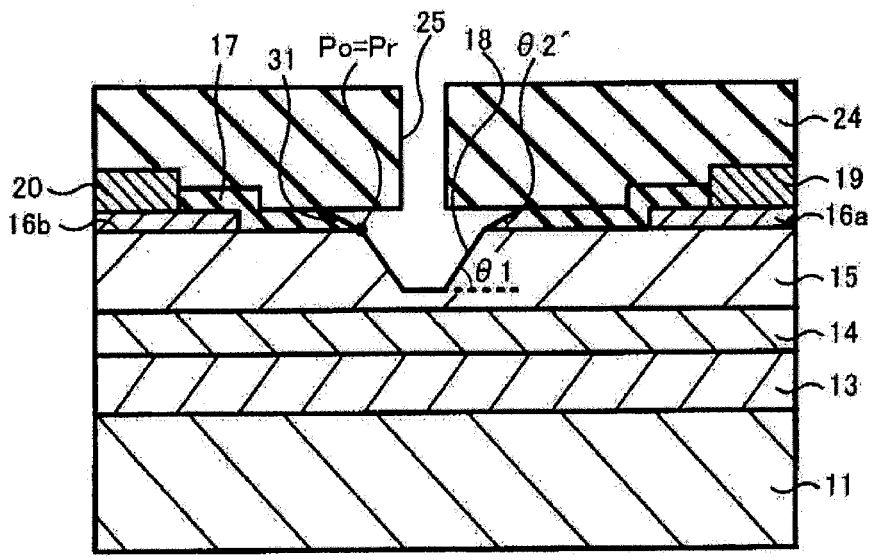
FIG. 12 is a cross-section corresponding to FIG. 11 for explaining the method for manufacturing the semiconductor device of the second embodiment and shows a process for forming a through hole in an insulating film.

The method for manufacturing the semiconductor device 30 can be applied similarly to the method for manufacturing the semiconductor device 10 of the first embodiment. Accordingly, the process for forming the through hole 31 in the insulating film 17 will be explained with reference to FIG. 12. FIG. 12 is a cross-section corresponding to FIG. 11 for explaining the method for manufacturing the semiconductor device 30 of the second embodiment.

First, similar to the process shown in FIG. 4, the recess area 18 is formed in the Schottky junction layer 15. Next, as shown in FIG. 12, with the removal of the insulating film 17 by using the first resist film 24 having the first opening part 25 as a mask, the through hole 31 is formed in the insulating film 17. The through hole 31, for example, is formed by etching back for a prescribed time using a buffered fluoric acid so that the sidewall has a desired angle θ2' (<θ1) of inclination. The reason for this is similar to that given for the process shown in FIG. 5.

However, in the method for manufacturing the semiconductor device 30 of this embodiment, the through hole 31 is formed so that its lower end Po and the upper end Pr of the recess area 18 are coincident with each other. Specifically, with the adjustment of the adhesive strength of the first resist film 24 and the insulating film 17 and the concentration of the buffered fluoric acid, compared to the method for manufacturing the semiconductor device 10 of the first embodiment, for example, the etching rate of the etching advancing in the horizontal direction is slowed. Therefore, the through hole 31 may be formed so that the lower end Po of the through hole 31 and the upper end Pr of the recess area 18 are coincident with each other.

Here, in the process for forming the through hole 31, compared to the method for manufacturing the semiconductor device 10 of the first embodiment, the etching time is shortened while maintaining the etching rate as it is, so that the lower end Po of the through hole 31 and the upper end Pr of the recess area 18 may be coincident with each other.

In this manner, each process, after forming the through hole 31 in the insulating film 17, is similar to that given for the method for manufacturing the semiconductor device 10 of the first embodiment. Therefore, their explanations are omitted.

In the semiconductor device 30 of the second embodiment and the method for manufacturing the semiconductor device 30 explained above, the recess area 18 and the through hole 31 of the insulating film 17 can also be formed so that their sidewalls are inclined. Therefore, for reasons similar to that given for the semiconductor device 10 of the first embodiment and the method for manufacturing the semiconductor device 10, the Schottky junction layer 15 in the recess area 18 can be suppressed from being contaminated. In addition, the generation of cracks in the gate electrode 32 can be suppressed. Thereby, the characteristic degradation of the semiconductor device 30 can be suppressed.

In addition, in regards to the semiconductor device 30 of the second embodiment and the method for manufacturing the semiconductor device 30, the gate electrode 32 can be formed so that the recess area 18 and the through hole 31 of the insulating film 17 are filled without a gap. Therefore, for a reason similar to that given for the semiconductor device 10 of the first embodiment and the method for manufacturing the semiconductor device 10, the resistance of the gate electrode 32 can be lowered, the performances of the semiconductor device 30 can be raised, and the damage to the gate electrode 32 or peeling-off of the gate electrode 32 from the Schottky junction layer 15 can be suppressed.

Moreover, according to the semiconductor device 30 of the second embodiment and the method for manufacturing the semiconductor device 30, since the lower end Po of the through hole 31 and the upper end Pr of the recess area 18 are coincident with each other, the surface of the Schottky junction layer 15 is entirely covered with the insulating film 17, except for the inside of the recess area 18. Therefore, in the formation process of the gate electrode 32 and during each manufacturing postprocess, the surface of the Schottky junction layer 15 is further suppressed from being contaminated, thus further suppressing the degradation of the performances of the semiconductor device 30.

While certain embodiments have been described, these embodiments have been presented by way of example only, and are not intended to limit the scope of the embodiments. Indeed, the novel embodiments described herein may be embodied in a variety of other forms; furthermore, various omissions, substitutions and changes in the form of the embodiments described herein may be made without departing from the spirit of the embodiments. The accompanying claims and their equivalents are intended to cover such forms or modifications as would fall within the scope and spirit of the embodiments.

What is claimed is:

1. A semiconductor device, comprising:
   a semiconductor layer that is formed on a semi-insulating semiconductor substrate, the semiconductor layer including an active layer and a Schottky junction layer formed on the active layer, the Schottky junction layer having a tapered recess area with an inclined sidewall;
   an insulating film that is formed on the semiconductor layer and has a through hole with a tapered shape and a sidewall that is inclined at an angle smaller than the angle of inclination of the sidewall of the recess area;
   a gate electrode formed so as to fill the recess area and the through hole; and
   a drain electrode and a source electrode formed on opposite sides of the recess area on the semiconductor layer.

2. The semiconductor device according to claim 1, wherein the recess area and the through hole are formed so that an upper end of the sidewall of the recess area and a lower end of the sidewall of the through hole are separated from each other.

3. The semiconductor device according to claim 2, wherein the inclined sidewall of the recess area has two inclined portions and a level portion that connects the two inclined portions.

4. The semiconductor device according to claim 1, wherein both sidewalls of the recess area are inclined by the same amount.

5. The semiconductor device according to claim 4, wherein both sidewalls of the through hole are inclined by the same amount.

6. The semiconductor device according to claim 1, wherein the recess area and the through hole are formed so that an upper end of the sidewall of the recess area and a lower end of the sidewall of the through hole are directly contacting each other.

7. The semiconductor device according to claim 1, wherein the angle of inclination of the sidewall of the recess area is in a range of 20° to 85°, and the angle of inclination of the sidewall of the through hole is in a range of 10° to 80°.

8. The semiconductor device according to claim 1, wherein the gate electrode protrudes upward from the through hole to be formed on the surface of the insulating film.

9. The semiconductor device according to claim 8, further comprising:

a surface protective layer that is formed on the insulating film to cover the gate electrode and is composed of the same material as that of the insulating film.

10. A semiconductor device, comprising:

a semiconductor layer that is formed on a semiconductor substrate, the semiconductor layer including an active layer and a Schottky junction layer formed on the active layer, the Schottky junction layer having a recess area with inclined sidewalls;

an insulating film that is formed on the semiconductor layer and has a through hole with inclined sidewalls that are inclined at an angle smaller than the angle of inclination of the inclined sidewalls of the recess area;

a drain electrode and a source electrode formed on opposite sides of the recess area on the semiconductor layer; and a gate electrode formed so as to fill the recess area and the through hole and to protrude above the levels of the drain electrode and the source electrode, the upper surface of the gate electrode having a downward concave shape.

11. The semiconductor device according to claim 10, wherein the gate electrode completely fills the recess area and the through hole so that there are no voids between the gate electrode and the inclined sidewalls of the recess area and the through hole.

* * * * *